(12) United States Patent
Rafalowski et al.

(10) Patent No.: US 11,385,458 B2
(45) Date of Patent: Jul. 12, 2022

(54) OPTICAL DEVICE FOR A VEHICLE COMPRISING A HEATING ELEMENT

(71) Applicant: Aptiv Technologies Limited, St. Michael (BB)

(72) Inventors: Arkadiusz Rafalowski, Brzezinka (PL); Witold Poreda, Ruciane Nida (PL)

(73) Assignee: Aptiv Technologies Limited, St. Michael (BB)

( * ) Notice: Subject to any disclaimer, the term of this patent is extended or adjusted under 35 U.S.C. 154(b) by 550 days.

(21) Appl. No.: 16/442,618

(22) Filed: Jun. 17, 2019

(65) Prior Publication Data
US 2019/0384055 A1 Dec. 19, 2019

(30) Foreign Application Priority Data

Jun. 18, 2018 (FR) ...................................... 1855336

(51) Int. Cl.
*H05K 1/02* (2006.01)
*G02B 27/00* (2006.01)
*G02B 7/02* (2021.01)

(52) U.S. Cl.
CPC ......... *G02B 27/0006* (2013.01); *G02B 7/021* (2013.01); *G02B 7/028* (2013.01);
(Continued)

(58) Field of Classification Search
CPC .... H05K 1/0212; H05K 1/0274; H05K 1/028; H05K 2201/10121; G02B 6/3897;
(Continued)

(56) References Cited

U.S. PATENT DOCUMENTS 9,961,722 B2 5/2018 Chae et al.
10,279,781 B2 5/2019 Zurowski et al.
(Continued)

FOREIGN PATENT DOCUMENTS

CN 106560742 4/2017
CN 106973202 7/2017
(Continued)

OTHER PUBLICATIONS

"Foreign Office Action", CN Application No. 201910521544.5, dated Mar. 3, 2021, 10 pages.
(Continued)

*Primary Examiner* — Hoa C Nguyen
(74) *Attorney, Agent, or Firm* — Sawtooth Patent Group PLLC (57) ABSTRACT

An optical device comprises a printed circuit board comprising a rigid main portion and comprising at least one flexible portion arranged at the periphery of the rigid main portion, the rigid main portion including an electronic image-capture circuit; a lens holder comprising at least one optical lens, the lens holder comprising a wall forming a cavity extending along the optical axis of the device from its top end to its bottom end, the bottom end being mounted on the rigid main portion of the printed circuit board so as to align, along the optical axis of the device, the electronic image-capture circuit and the optical lens; at least one heating element arranged on the flexible portion of the printed circuit board, the flexible portion of the printed circuit board being arranged by bearing directly against the wall of the lens holder.

20 Claims, 5 Drawing Sheets (52) U.S. Cl.
CPC ........... *H05K 1/028* (2013.01); *H05K 1/0212* (2013.01); *H05K 1/0274* (2013.01); *H05K 2201/10121* (2013.01)

(58) Field of Classification Search
CPC .. G02B 6/428; G02B 6/4281; G02B 6/02204; G02B 7/1815; G02B 7/021; G02B 7/028; G02B 27/0006
See application file for complete search history.

(56) References Cited

U.S. PATENT DOCUMENTS

| | | | |
|---|---|---|---|
| 2004/0136090 A1 | 7/2004 | Iikawa et al. | |
| 2012/0170119 A1 | 7/2012 | Chu et al. | |
| 2013/0270441 A1* | 10/2013 | Burt | H04N 5/3656 250/353 |
| 2017/0099700 A1 | 4/2017 | Chae et al. | |
| 2017/0129418 A1* | 5/2017 | Koshiba | B60R 11/04 |
| 2018/0176431 A1 | 6/2018 | Kim et al. | |
| 2018/0243804 A1* | 8/2018 | Magee | B08B 7/04 |
| 2018/0345911 A1* | 12/2018 | Zurowski | G03B 17/12 |
| 2019/0381939 A1 | 12/2019 | Rafalowski et al. | |

FOREIGN PATENT DOCUMENTS

| | | |
|---|---|---|
| CN | 107333045 | 11/2017 |
| CN | 107690594 | 2/2018 |
| CN | 207039747 | 2/2018 |
| CN | 207184639 | 4/2018 |
| CN | 207438964 | 6/2018 |
| CN | 105791642 | 4/2020 |
| CN | 107735726 | 6/2021 |
| EP | 3153922 | 4/2017 |
| EP | 3 410 199 A1 | 12/2018 |
| GN | 105791642 | 4/2020 |
| WO | 2016195403 | 12/2016 |
| WO | 2017/208981 A1 | 12/2017 |
| WO | 2018052043 | 3/2018 |

OTHER PUBLICATIONS

"Extended European Search Report", EP Application No. 19181023.3, dated Nov. 12, 2019, 8 pages.
"Extended European Search Report", EP Application No. 19180952.4, dated Nov. 14, 2019, 9 pages.
"Foreign Office Action", CN Application No. 201910521543.0, dated Sep. 11, 2020, 15 pages.
"Foreign Office Action", CN Application No. 201910521544.5, dated Aug. 12, 2021, 28 pages.

* cited by examiner

OPTICAL DEVICE FOR A VEHICLE COMPRISING A HEATING ELEMENT

CROSS-REFERENCE TO RELATED APPLICATION

This application claims the benefit under 35 U.S.C. § 119(a) of European Patent Application FR 1855336, filed Jun. 18, 2018, the entire disclosure of which is hereby incorporated herein by reference.

TECHNICAL FIELD

This disclosure generally relates to an optical device for a vehicle and more particularly to an optical device comprising a heating element.

BACKGROUND

Electronic members for a motor vehicle that are arranged on the exterior of the vehicles must be subject to environmental constraints such as cold and ice. In order not to suffer the persistent effects of these constraints, these electronic members are generally equipped with electrical devices allowing to get rid of the effects of these constraints. For example, electronic members equipped with electrical devices can be found such as for example heating elements for fighting frost.

These electrical devices are generally piloted by means of wiring harnesses and connectors connecting an electronic control board and the electrical devices.

Current solutions for electrical connection of these electrical devices are bulky, expensive and heavy.

SUMMARY

Described herein is an optical device that comprises a printed circuit board comprising a rigid main portion and comprising at least one flexible portion arranged at the periphery of the rigid main portion, the rigid main portion including an electronic image-capture circuit; a lens holder comprising at least one optical lens, the lens holder comprising a wall forming a cavity extending along the optical axis of the device from its top end to its bottom end, the bottom end being mounted on the rigid main portion of the printed circuit board so as to align, along the optical axis of the device, the electronic image-capture circuit and the optical lens; at least one heating element arranged on the flexible portion of the printed circuit board, the flexible portion of the printed circuit board being arranged by bearing directly against the wall of the lens holder.

The top end of the wall of the lens holder may comprise a flange oriented outwardly of the wall of the lens holder forming a planar bearing surface, the flexible portion of the printed circuit board being arranged by bearing only against the planar bearing surface of the wall of the lens holder. The heating element can be arranged by bearing directly on the wall of the lens holder. A metal clamping ring can be arranged around the wall of the lens holder so that each flexible portion of the printed circuit board is pinched between the metal ring and the wall. Each flexible portion of the printed circuit board can be pinched between the wall of the lens holder and a wall of a protective casing of the optical device. The heating element may be a conductive trace pattern of the flexible portion of the printed circuit board.

The flexible portion of the printed circuit board may comprise a heating section and an intermediate section comprised between the heating section and the rigid main portion of the printed circuit board, the intermediate section comprising a thinned portion of the substrate of the rigid main portion of the printed circuit board, the heating section comprising the heating element. Each side of the rigid main portion of the printed circuit board may be in continuity with a flexible portion including a heating element.

According to the invention, a method for assembling the optical device described above includes the following steps: providing a printed circuit board comprising a rigid main portion including an electronic image-capture component, and at least one flexible portion including a heating element and extending generally in the plane of the rigid main portion; arranging the rigid main portion of the printed circuit board on a lens holder including at least one optical lens and comprising a wall forming a cavity extending along the optical axis of the device so as to align, along the optical axis the device, the electronic image-capture circuit and the optical lens; folding the flexible portion of the printed circuit board until abutment of the flexible portion on the wall of the lens holder; fixing the flexible portion of the printed circuit board bearing against the wall of the lens holder. The folding step and the fixing step can be done either by insertion of the lens holder into a protective casing of the optical device so as to pinch the flexible portion between the wall of the protective casing and the wall of the lens holder, or by insertion of a clamping ring around the wall of the lens holder and the flexible portion so as to pinch the flexible portion between the clamping ring and the wall of the lens holder.

Further features and advantages will appear more clearly on a reading of the following detailed description of the preferred embodiment, which is given by way of non-limiting example only and with reference to the accompanying drawings.

BRIEF DESCRIPTION OF DRAWINGS

Other characteristics, objects and advantages will become apparent upon reading the following detailed description, and with reference to the appended drawings, given by way of non-limiting example and in which.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for describing embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

In order to facilitate the description, and not exclusively, an orthogonal reference frame comprising a longitudinal axis L, a transverse axis T and a vertical axis V is defined. "Bottom", "top", "above", "below", "lower" and "upper" orientations are defined along the vertical direction. "Left", "right" and "lateral" orientations are defined according to the transverse direction. "Front" and "rear" orientations are also defined along the longitudinal direction.

Figure 1:
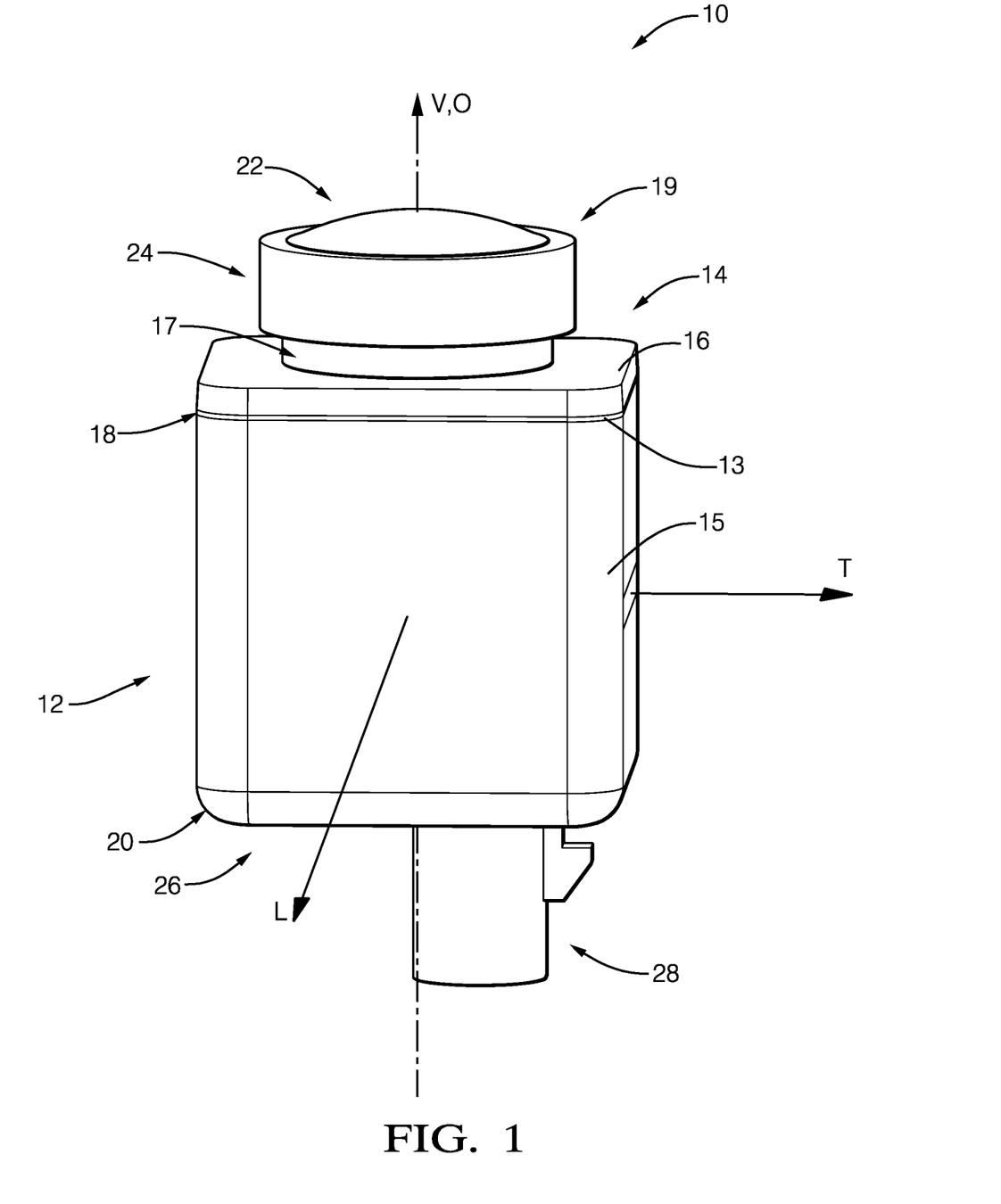
FIG. 1 is a schematic perspective view of the optical device according to the one embodiment.
Figure 2:
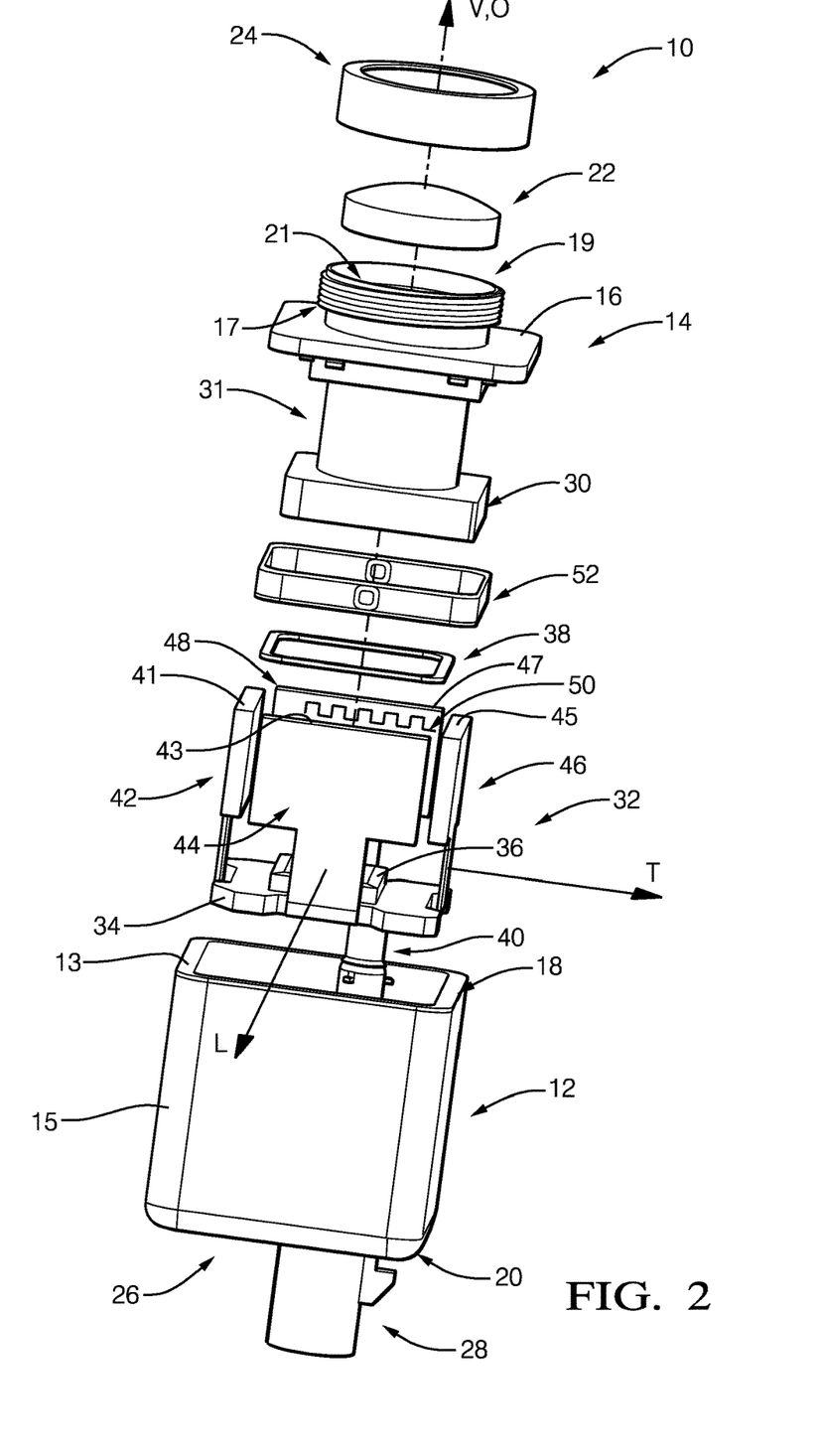
FIG. 2 is a schematic perspective exploded view of the optical device of FIG. 1.

According to FIG. 1 and FIG. 2, an optical device 10, more particularly a camera for a vehicle is represented. This type of camera is provided to be mounted on the exterior of the vehicle and therefore to undergo the external conditions to the vehicle such as the climate.

According to FIG. 1, the optical device 10 comprises a protective casing 12 comprising a wall 15 of generally cylindrical shape extending along the vertical axis V from its top end 18 to its bottom end 20. The bottom end 20 of the protective casing 12 is closed by a casing bottom 26. The casing bottom 26 comprises a connector body 28 extending vertically outwardly of the protective casing 12, the connector body 28 being formed integrally with the casing bottom 26.

The optical device 10 comprises a lens holder 14 extending vertically in the protective casing 12. The lens holder 14 is an open hollow structure forming a cavity 21 extending from its top end 19 arranged outside the protective casing 12 up to its bottom end 30 inserted in the protective casing 12. The top end 19 of the lens holder 14 includes an optical lens 22 aligned along the optical axis O of the optical device 10.

The lens holder 14 is held in abutment against the top end 18 of the protective casing 12. The lens holder 14 therefore comprises a bearing plate 16 arranged in abutment against the top end 18 of the protective casing 12. The lens holder 14 is fixed by bearing against the top end 18 of the protective casing 12 by means of a first adhesive seal 13 so as to hermetically seal the protective casing 12. The bearing plate 16 comprises a circular aperture opening onto the cavity 21 of the lens holder 14 and including an upper wall 17 to the protective casing 12 extending vertically up to the top end 19 of the lens holder 14. The optical lens 22 is arranged against the inner surface of the upper wall 17 and is kept aligned along the optical axis O of the optical device 10 by a holding cap 24 fixed on the upper wall 17.

According to FIG. 2, the lens holder comprises the upper wall 17 arranged above the bearing plate 16 and comprises a lower wall 31 to the protective casing 12 extending vertically from the bearing plate 16 up to its bottom end 30. The bottom end 30 forms a base of generally parallelepiped shape.

The optical device 10 comprises a printed circuit board 32 including a rigid main portion 34.

The rigid main portion 34 is of generally rectangular shape. The rigid main portion 34 comprises, on its upper face, an electronic image-capture circuit 36 aligned with the optical lens 22 along the optical axis O of the optical device 10. The rigid main portion 34 is provided to be fixed on the bottom lens 30 of the lens holder 14 by means of a second adhesive seal 38, so as to hermetically seal the cavity 21 of the lens holder 14. The rigid main portion 34 also comprises, on its lower face, electrical terminals 40 extending vertically and provided to be inserted into the body of the connector 28. The rigid main portion 34 is therefore provided to be at the bottom of the casing 26 so that its electrical terminals 40 can be arranged in the body of the connector 28.

The printed circuit board 32 also comprises four flexible portions 42, 44, 46, 48 arranged at the periphery of the rigid main portion 34. More particularly, each side of the rigid main portion 34 is extended by material continuity by a flexible portion 42, 44, 46, 48. Each flexible portion 42, 44, 46, 48 is folded vertically upwards so as to bear on the lower wall 31 of the lens holder 14.

In order to maintain the flexible portions 42, 44, 46, 48 bearing on the lower wall 31 of the lens holder 14, a clamping ring 52 is configured to be arranged around the flexible portions 42, 44, 46, 48 so as to compress and pinch the flexible portions 42, 44, 46, 48 between the lower wall 31 of the lens holder 14 and the clamping ring 52.

Alternatively, the holding of the flexible portions 42, 44, 46, 48 bearing against the lower wall 31 of the lens holder 14 can be achieved by the inner face of the cylindrical wall 15 of the protective casing 12, the cylindrical wall 15 allowing to compress and pinch the flexible portions 42, 44, 46, 48 between the lower wall 31 of the lens holder 14 and the inner face of the cylindrical wall 15 of the protective casing 12.

Each flexible portion 42, 44, 46, 48 comprises heating means 50 configured to heat the lower wall 31 of the lens holder 14. In order to optimize the heat transfer to the lens holder 14, the heating means 50 are also arranged by bearing against the lower wall 31 of the lens holder 14. The diffusion of heat through the lens holder 14 makes it possible, when necessary to demist and/or defrost the lens/lenses 22 arranged on the lens holder 14.

Since the lens 22 most exposed to climatic conditions is the lens 22 arranged at the top end 19 of the lens holder 14, preferably the heating means 50 are arranged at the free end 41, 43, 45, 47 according to the vertical direction of each flexible portion 42, 44, 46, 48, closest to the bearing plate 16 of the lens holder 14.

The heating means 50 may be resistive electrical elements arranged on the flexible portions 42, 44, 46, 48 of the printed circuit board 32. The resistive electrical elements may for example be resistive patterns comprising electrical conductive traces, such as copper conductive tracks, the electrical traces being traced in the form of crenellations so as to maximize the heat produced by an electric current passing through the electrical traces.

In a non-limiting manner, the electric current can be produced by a circuit for controlling the defrosting of the lens 22, arranged outside the camera. The electric current can circulate in each flexible portion 42, 44, 46, 48 via, the electrical terminals 40 of the rigid main portion 34.

Figure 3:
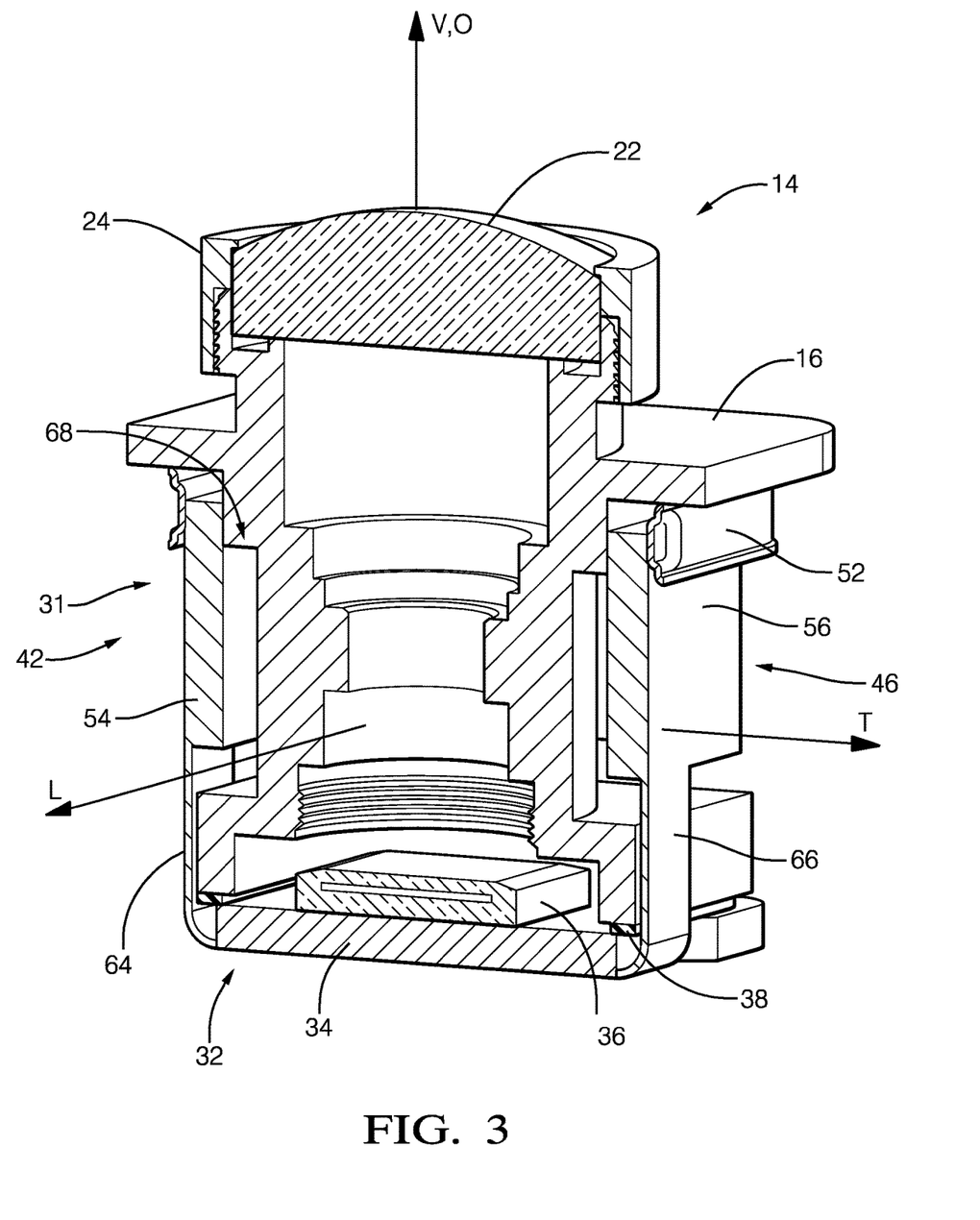
FIG. 3 is a partial schematic perspective view in cross section of the optical device of FIG. 1 illustrating the heating element arranged on the lens holder.

According to FIG. 3, the flexible portions 42, 44, 46, 48 of the printed circuit board 32 each comprise a heating section 54, 56 and an intermediate section 64, 66 comprised between the heating section 54, 56 and the rigid main portion 34 of the printed circuit board 32. Each intermediate section 64, 66 is formed by a thinned portion of the substrate of the rigid main portion 34 of the printed circuit board 32. Each heating section 54, 56 is generally of similar substrate thickness of the rigid main portion 34 of the printed circuit board 32.

In a general manner, each intermediate portion 64, 66 comprises electrical connections allowing to supply the heating elements 50 arranged on each heating section 54, 56 of each flexible portion 54, 56.

The clamping ring 52 is arranged around the heating sections 54, 56 and is also arranged in contact with the bearing plate 16 of the lens holder 14. In other words, the clamping ring 52 is arranged around the free ends 41, 43, 45, 47 along the vertical direction of the heating sections 54, 56 and also forms a heat pipe of each heating section 54, 56 toward the bearing plate 16 of the lens holder 14.

Also, the top end of the lower wall 31 of the lens holder 14 comprises a flange 68 oriented outwardly of the bottom wall 31 forming a planar bearing surface, each heating section 54, 56 being arranged by bearing only against the planar bearing surface of the bottom wall 31.

Thus, the heat diffusion towards the optical lens 22 arranged on the top end 19 of the lens holder 14 is optimized. A metal clamping ring 52 allowing to optimize at best the heat dissipation towards the lens holder 14 and therefore towards the optical lens 22. A metal lens holder 14 also allows the optimum heat to be diffused towards the optical lens 15.

Although the embodiment represented by FIGS. 1, 2 and 3 comprises four flexible portions 42, 44, 46, 48, it only takes at least one flexible portion 42 comprising a heating means 50 and arranged by bearing in contact with the lower wall 31 of the lens holder 14, to allow diffusing heat towards the optical lens 22. Nevertheless, the use of four flexible portions 42, 44, 46, 48 makes it possible to obtain a higher heat and a better distribution of heat around the lens holder 14.

According to FIGS. 4, 5, 6, 7, 8 and 9, six steps of assembling the optical device 10 are represented.

Figure 4:
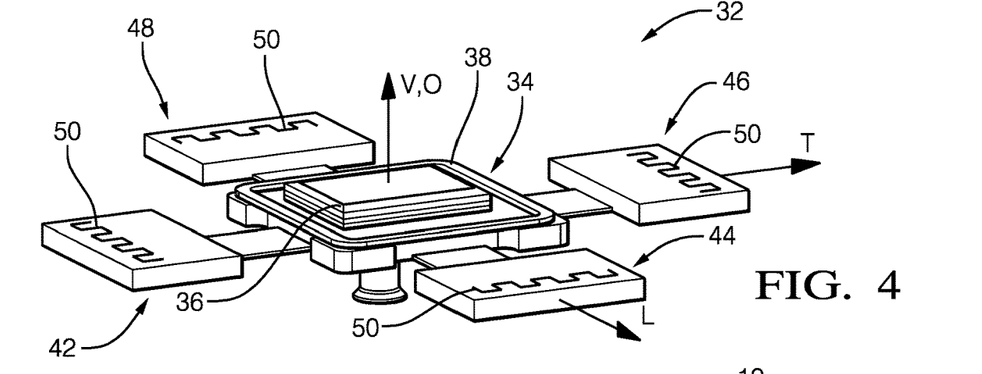
FIGS. 4, 5, 6, 7, 8 and 9 are schematic perspective views of six steps of assembling the optical device according to one embodiment.

According to FIG. 4, a first step consists in providing the printed circuit board 32 including the electronic image-capture component 32. More particularly, the printed circuit board 32 comprises the rigid main portion 34 including the electronic image—capture component 36, and the four flexible portions 42, 44, 46, 48 each including a heating element 50. Prior to the assembly of the optical device 10, the four flexible portions 42, 44, 46, 48 extend generally in the plane of the rigid main portion 34. The second adhesive seal 38 may be pre-assembled on the rigid main portion 34.

Figure 5:
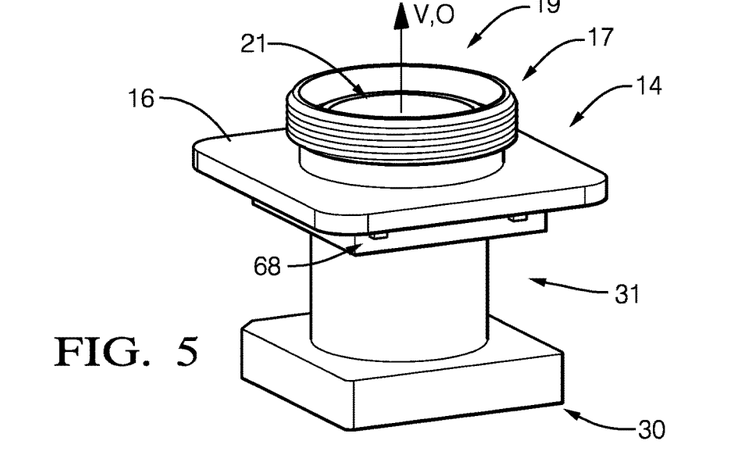

According to FIG. 5, a step consists in providing the lens holder 14. The lens holder 14 comprises a vertical wall forming the cavity 21 of the lens holder. The bottom end 30 of the lens holder 14 is provided to be assembled on the rigid main portion 34 of the printed circuit board 32, the top end 19 of the lens holder 14 being configured to receive the optical lens 22 so that the optical lens 22 is aligned along the optical axis O of the optical device 10 with the electronic image-capture component 36. According to the particular embodiment represented, the vertical wall of the lens holder 14 comprises the abutment plate 16 arranged transversely to the lens holder 14 and comprising the circular aperture arranged around the cavity of the lens holder 14. The abutment plate 16 divides the wall of the lens holder 14 on either side of the abutment plate 16. The vertical lower wall 31 arranged under the abutment plate 16 is provided to be inserted into the protective casing 12 of the optical device 10. The vertical upper wall 17 arranged above the abutment plate 16 is provided to be arranged on the exterior of the protective casing 12. The top end 19 of the outer wall 17 may in particular comprise a thread in order to fix the optical lens 22 holding cap 24 by screwing.

Figure 6:
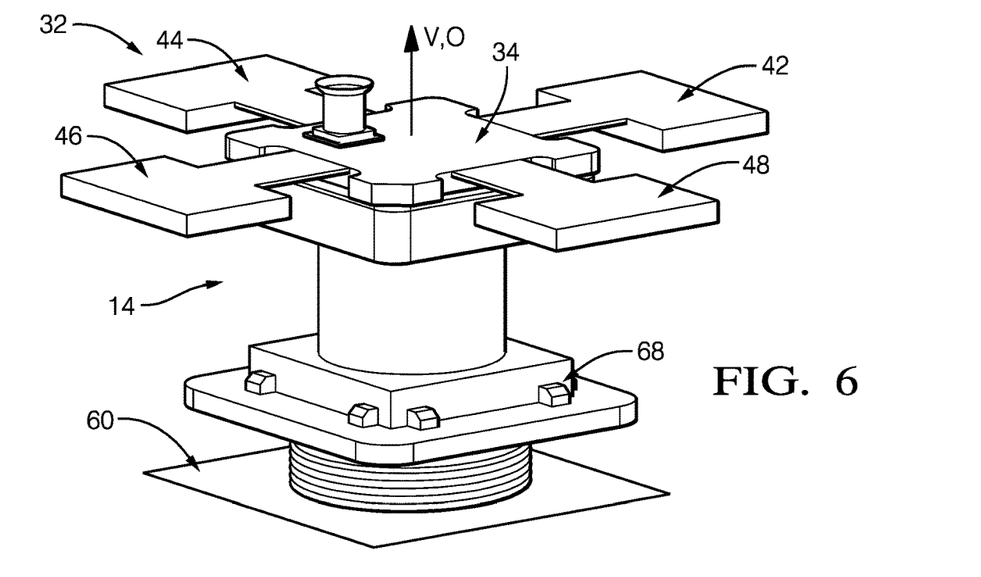

According to FIG. 6, a first step of assembling the printed circuit board 32 with the lens holder 14 is represented. The lens holder 14 is positioned inverted so that its top end 19 is disposed by bearing on a base 60, the bottom end 30 of the lens holder 14 being oriented upwards along the vertical axis V.

The rigid main portion 34 of the printed circuit board 32 is fixed by bearing against the bottom end 30 of the lens holder 14, the electronic image-capture component 36 being oriented inwardly of the cavity 21 of the lens holder 14. Preferably, the alignment along the optical axis O of the optical device 10 of the electronic image—capture component 36 and the optical lens 22 is made before the second adhesive seal 38 permanently fixes the rigid main portion 34 of the printed circuit board 32 on the bottom end 30 of the lens holder 14. At this step, it should be noted that the four flexible portions 42, 44, 46, 48 of the printed circuit board 32 each including a heating element 50 extend also generally in the plane of the rigid main portion 34. Indeed, the structure of this type of printed circuit board 32 commonly called flex-rigid printed circuit, requires the application of a force F on the flexible portions 42, 44, 46, 48 so as to fold them along a desired folding angle with the rigid main portion 34.

Figure 7:
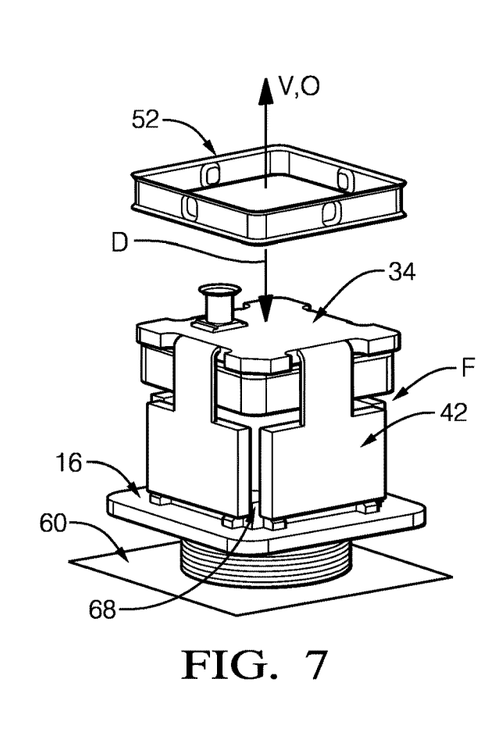

According to FIG. 7, a step of folding the flexible portions 42, 44, 46, 48 is illustrated. In order to carry out this folding step, the lens holder 14 is always held with its top end 19 disposed by bearing on the base 60. A bearing force F has been exerted on the flexible portions 42, 44, 46, 48 so as to position them by bearing against the wall 31 of the lens holder 14. In order to hold the flexible portions 42, 44, 46, 48 fixedly against the wall 31 of the lens holder 14, the clamping ring 52 is inserted along the vertical direction D around the flexible portions 42, 44, 46, 48.

Figure 8:
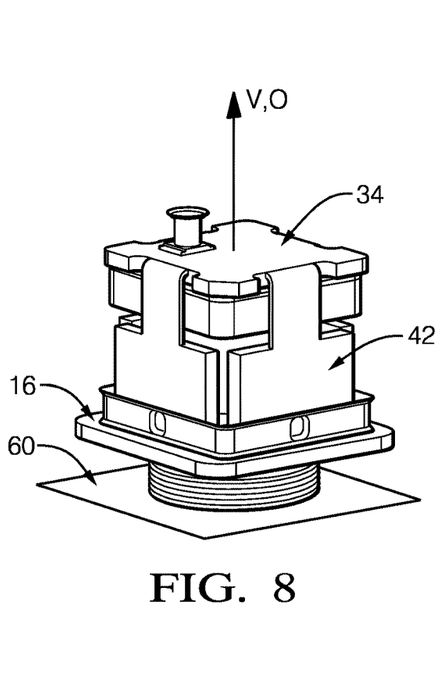

According to FIG. 8, the clamping ring 52 is inserted around the flexible portions 42, 44, 46, 48 until its abutment against the bearing plate 16 of the lens holder 14. The clamping ring 52 can be adjusted to compress and pinch the flexible portions 42, 44, 46, 48 between the clamping ring 52 and the wall 31 of the lens holder 14.

Optimally, the folding step and the step of inserting the clamping ring 52 around the flexible portions 42, 44, 46, 48, can be combined so that it is the insertion of the clamping ring 52 along the vertical direction D that causes the folding of the flexible portions 42, 44, 46, 48, the clamping ring 52 being previously arranged on the flexible portions 42, 44, 46, 48 when these still extend generally in the plane of the rigid main portion 34 as illustrated in FIG. 6.

Figure 9:
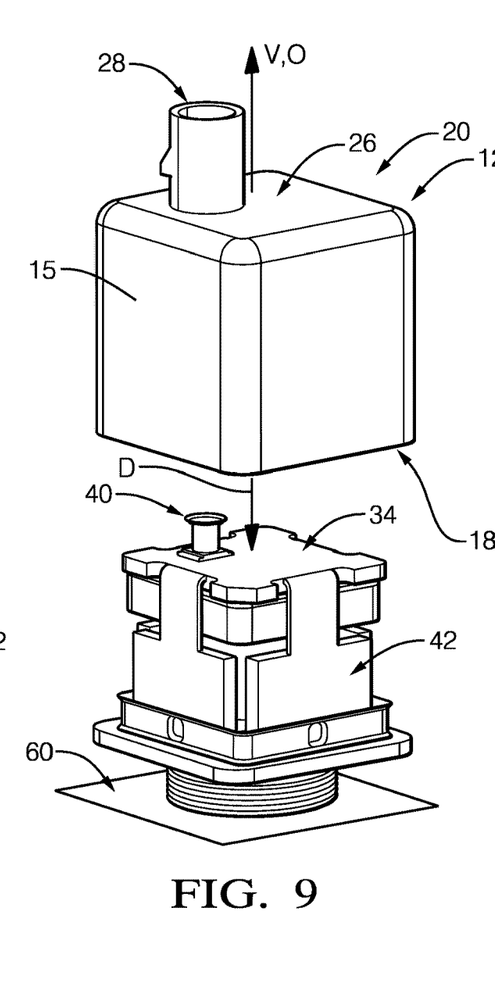

According to FIG. 9, a last step of assembling the optical device 10 comprises the insertion of the protective casing 12. The insertion of the protective casing 12 is also done with the inverted lens holder 14 so that its top end 19 is always bearing on the base 60. The protective casing 12 is inserted along the vertical direction D downwards until abutment of its bottom end 18 against the abutment plate 16 of the lens holder 14. It is during this step that the rigid main portion 34 of the printed circuit board 32 is arranged in the casing bottom 26 so that the electrical terminals 40 is inserted into the body of the connector 28 of the protective casing 12.

Alternatively to the folding step and to the step of inserting the clamping ring 52 around the flexible portions 42, 44, 46, 48, the clamping ring 52 may be substituted by the wall 15 of the protective casing 12. According to this alternative, the top end 18 of the protective casing 12 is previously arranged on the flexible portions 42, 44, 46, 48 when these still generally extend in the plane of the rigid main portion 34 as illustrated in FIG. 6. It is the insertion of the protective casing 12 along the vertical direction D which causes the folding of the flexible portions 42, 44, 46, 48, the flexible portions 42, 44, 46, 48 can then be held by bearing against the wall 31 of the lens holder 14 by the wall 15 of the protective casing 12.

In order to prevent the flexible portions 42, 44, 46, 48 from being damaged, when the wall 15 of the protective casing 12 allows the flexible portions 42, 44, 46, 48 to be folded and the flexible portions 42, 44, 46, 48 to be held by bearing against the wall 31 of the lens holder 14, the top end 18 of the wall 15 of the protective casing 12 comprises inclined slope edges, each edge forming a chamfer oriented towards the inner surface of the wall 45 of the protective casing 12. Each inclined slope edge is arranged in the vertical alignment of each flexible portion 42, 44, 46, 48 so as, for example, to avoid shearing of the flexible portions 42, 44, 46, 48 during this assembly step.

While this invention has been described in terms of the preferred embodiments thereof, it is not intended to be so limited, but rather only to the extent set forth in the claims that follow.

We claim:

1. An optical device comprising:
    a printed circuit board comprising a rigid main portion and at least one flexible portion arranged at a periphery of the rigid main portion, the rigid main portion including an electronic image-capture circuit;
    a lens holder comprising at least one optical lens, the lens holder comprising a wall forming a cavity extending along an optical axis of the device from a top end to a bottom end of the wall, the bottom end being mounted on the rigid main portion of the printed circuit board so as to align, along the optical axis of the device, the electronic image-capture circuit and the optical lens; and
    at least one heating element arranged on the flexible portion of the printed circuit board, the flexible portion of the printed circuit board being arranged to bear directly against the wall of the lens holder to enable heating of the wall of the lens holder via the heating element.

2. The optical device according to claim 1, wherein the top end of the wall of the lens holder comprises a flange oriented outwardly of the wall of the lens holder forming a planar bearing surface, the flexible portion of the printed circuit board being arranged to bear only against the planar bearing surface of the wall.

3. The optical device according to claim 1, wherein the heating element is arranged to bear directly on the wall.

4. The optical device according to claim 1, wherein a metal clamping ring is arranged around the wall of the lens holder so that each flexible portion of the printed circuit board is pinched between the metal ring and the wall of the lens holder.

5. The optical device according to claim 1, wherein each flexible portion of the printed circuit board is pinched between the wall of the lens holder and a cylindrical wall of a protective casing of the optical device.

6. The optical device according to claim 1, wherein the heating element comprises a conductive trace pattern of a flexible portion of the printed circuit board.

7. The optical device according to claim 1, wherein the flexible portion of the printed circuit board comprises a heating section and an intermediate section located between the heating section and the rigid main portion of the printed circuit board, the intermediate section comprising a thinned portion of a substrate of the rigid main portion of the printed circuit board, the heating section comprising the heating element.

8. The optical device according to claim 1, wherein each side of the rigid main portion of the printed circuit board is in continuity with a flexible portion each including a heating element.

9. The optical device according to claim 1, wherein the flexible portion is configured to bend to be perpendicular to the rigid main portion.

10. The optical device according to claim 1, wherein the optical device is configured to be disposed in a vehicle.

11. The optical device according to claim 1, wherein the heating element is configured to remove frost from the optical lens.

12. A printed circuit board comprising:
    a rigid main portion including an electronic image-capture circuit; and
    at least one flexible portion arranged at a periphery of the rigid main portion, the flexible portion:
        comprising at least one heating element; and
        configured to heat a wall of a lens holder that houses a lens for the electronic image-capture circuit when the lens holder and the printed circuit board are assembled together, the flexible portion configured to heat the wall of the lens holder via the heating element by bearing directly against the wall of the lens holder.

13. The printed circuit board according to claim 12, wherein the heating element is configured on the flexible portion such that the heating element bears directly on the wall of the lens holder when the lens holder and the printed circuit board are assembled together.

14. The printed circuit board according to claim 12, wherein the heating element comprises a conductive trace pattern.

15. The printed circuit board according to claim 12, wherein the flexible portion further comprises a heating section that comprises the heating element and an intermediate section located proximate the rigid main portion and comprising a thinned portion of a substrate of the rigid main portion.

16. The printed circuit board according to claim 12, wherein:
the rigid main portion comprises a plurality of sides;
the at least one flexible portion comprises a plurality of flexible portions; and
the sides of the rigid main portion are in continuity with respective flexible portions.

17. The printed circuit board according to claim 12, wherein the flexible portion is configured to bend to be perpendicular to the rigid main portion when the lens holder and the printed circuit board are assembled together.

18. The printed circuit board according to claim 12, wherein the printed circuit board is configured to be disposed within a cylindrical wall of a protective casing of an optical device.

19. A method for assembling an optical device, said method comprising:
providing a printed circuit board comprising a rigid main portion including an electronic image-capture component, and at least one flexible portion including a heating element and extending generally in a plane of the rigid main portion;
arranging the rigid main portion of the printed circuit board on a lens holder including at least one optical lens and comprising a wall forming a cavity extending along an optical axis of the device so as to align, along the optical axis of the device, the electronic image-capture component and the optical lens;
folding the flexible portion of the printed circuit board until abutment of the flexible portion on the wall of the lens holder; and
fixing the flexible portion of the printed circuit board bearing against the wall of the lens holder to enable heating of the wall of the lens holder via the heating element.

20. The method according to claim 19, wherein the folding and the fixing are done either by insertion of the lens holder into a protective casing of the optical device so as to pinch the flexible portion between the wall of the protective casing and the wall of the lens holder, or by insertion of a clamping ring around the wall of the lens holder and the flexible portion so as to pinch the flexible portion between the clamping ring and the wall of the lens holder.

* * * * *